(12) United States Patent
Tanaka et al.

(10) Patent No.: US 7,476,341 B2
(45) Date of Patent: Jan. 13, 2009

(54) PROCESS FOR PRODUCING PHOTO-CONDUCTOR LAYERS FOR CONSTITUTING RADIATION IMAGING PANELS

(75) Inventors: Motoyuki Tanaka, Kanagawa-ken (JP); Shigeru Nakamura, Kanagawa-ken (JP); Kiyoteru Miyake, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 531 days.

(21) Appl. No.: 11/236,597

(22) Filed: Sep. 28, 2005

(65) Prior Publication Data

US 2006/0065880 A1   Mar. 30, 2006

(30) Foreign Application Priority Data

Sep. 28, 2004  (JP)  ............................ 2004-282000
Sep. 28, 2004  (JP)  ............................ 2004-282001

(51) Int. Cl.
*H01L 21/00*   (2006.01)
*B22F 3/10*    (2006.01)

(52) U.S. Cl. ............... 252/518.1; 430/321; 430/901; 419/56

(58) Field of Classification Search ........... 252/518.1; 250/580; 430/321, 901; 419/56
See application file for complete search history.

(56) References Cited

U.S. PATENT DOCUMENTS 3,810,688 A  *  5/1974  Ballman et al. ............ 385/2
4,702,791 A  * 10/1987  Mimura et al. ........... 117/104

FOREIGN PATENT DOCUMENTS

JP   11-237478 A   8/1999
JP   2000-249769 A   9/2000
SU   1468987   *  3/1989

OTHER PUBLICATIONS

Takahashi et al "Electrical Conduction of Bi4Ti3O12 Ceramics . . . ", Trans Mat Res Soc of Japan, 27(1) 231-234 (2002).*
Valant et al "Microstructure vs Dielectric Property Correlation in the Stoichiometric Sillenites", Korean J. Crystall 11(4) 191-194 (2000).*
Miyayama et al "Mixed electrical conduction in sintered bcc 6Bi2O3-SiO2", Journal of Materials Science 18(1983) 3023-3030.*
M. Valant et al., "Processing and Dielectric Properties of Sillenite Compounds $Bi_{12}MO_{20-8}$ (M=Si, Ge, Ti, Pb, Mn, $B_{½}P_{½}$)", J. Am. Ceram. Soc., vol. 84, pp. 2900-2904, 2001.
A. Morell et al., "Sintering of an X-Ray Photosensitive Ceramic: $Bi_{12}GeO_{20}$", vol. 58, pp. 613-615, 1979.
"Handbook of Ceramics", Second Edition, edited by The Ceramic Society of Japan, pp. 423-426.

* cited by examiner

*Primary Examiner*—Mark Kopec
(74) *Attorney, Agent, or Firm*—Sughrue Mion, PLLC (57) ABSTRACT

A photo-conductor layer for constituting a radiation imaging panel, which photo-conductor layer is capable of recording radiation image information as an electrostatic latent image, is produced. The photo-conductor layer contains a $Bi_{12}MO_{20}$ sintered material, in which M represents at least one kind of element selected from the group consisting of Ge, Si, and Ti. Sintering processing for the formation of the $Bi_{12}MO_{20}$ sintered material is performed in an inert gas, atmosphere. Alternatively, the sintering processing is performed at a sintering temperature falling within the range of 800° C. to 900° C. and in an atmosphere, in which an oxygen partial pressure $P_{O2}$ (Pa) satisfies the condition $10^{-3} \leq P_{O2} \leq 10^{-1}$.

7 Claims, 6 Drawing Sheets

PROCESS FOR PRODUCING PHOTO-CONDUCTOR LAYERS FOR CONSTITUTING RADIATION IMAGING PANELS

BACKGROUND OF THE INVENTION

1. Field of the Invention

This invention relates to a photo-conductor layer for constituting a radiation imaging panel, which is appropriate for use in a radiation imaging apparatus, such as an X-ray imaging apparatus.

2. Description of the Related Art

There have heretofore been proposed X-ray imaging panels designed for use in a medical X-ray image recording operation, such that a radiation dose delivered to an object during the medical X-ray image recording operation may be kept small, and such that the image quality of an image and its capability of serving as an effective tool in, particularly, the efficient and accurate diagnosis of an illness may be enhanced. With the proposed X-ray imaging panels, a photo-conductor layer sensitive to X-rays is employed as a photo-sensitive material. The photo-conductor layer is exposed to X-rays carrying X-ray image information, and an electrostatic latent image is thereby formed on the photo-conductor layer. Thereafter, the electrostatic latent image, which has been formed on the photo-conductor layer, is read out by use of light or a plurality of electrodes. The techniques utilizing the X-ray imaging panels have advantages over the known photo-fluorography utilizing TV image pickup tubes in that an image is capable of being obtained with a high resolution.

Specifically, when X-rays are irradiated to a charge forming layer located in the X-ray imaging panel, electric charges corresponding to X-ray energy are formed in the charge forming layer. The thus formed electric charges are read out as an electric signal. The photo-conductor layer described above acts as the charge forming layer. As the material for the photo-conductor layer, amorphous selenium (a-Se) has heretofore been used. However, ordinarily, amorphous selenium has the problems in that it is necessary for the layer thickness of the photo-conductor layer to be set to be large (e.g., at least 500 µm) because of a low radiation absorptivity of amorphous selenium.

However, in cases where the layer thickness of the photo-conductor layer is set to be large, the electric charge collecting efficiency becomes low, and it becomes necessary for a high voltage to be applied across the photo-conductor layer. However, in such cases, the problems occur in that electric charges due to a dark current are apt to occur, the contrast in a low dose region becomes low, and device deterioration is apt to occur. Also, the problems occur in that noise (structure noise) occurring due to a variation in selenium in the thickness direction is apt to be collected. Further, ordinarily, the photo-conductor layer is formed by use of a vacuum evaporation technique. However, in cases where the vacuum evaporation technique is employed, considerable time is required to grow the photo-conductor layer up to the large layer thickness described above, and management of the growth of the photo-conductor layer is not easy to perform. As a result, the production cost of the photo-conductor layer is not capable of being kept low, and the cost of the X-ray imaging panel is not capable of being kept low.

Because of the problems described above, it has been studied to utilize materials for the photo-conductor layer other than amorphous selenium. By way of example, as a substance for constituting the photo-conductor layer, there has been proposed a bismuth oxide type of a composite oxide. The proposed bismuth oxide type of the composite oxide may be represented by the formula $Bi_xMO_y$, in which M represents at least one kind of element selected from the group consisting of Ge, Si, and Ti, x represents a number satisfying the condition $10 \leq x \leq 14$, and y represents the stoichiometric oxygen atom number in accordance with M and x. The proposed bismuth oxide type of the composite oxide is described in, for example, each of Japanese Unexamined Patent Publication Nos. 11(1999)-237478 and 2000-249769. With the proposed bismuth oxide type of the composite oxide, it is expected that the efficiency, with which the X-rays are converted into the electric charges, will be capable of being enhanced.

However, in each of Japanese Unexamined Patent Publication Nos. 11(1999)-237478 and 2000-249769 described above, as a technique for forming the photo-conductor layer, a technique is employed, wherein a sol or a gel having been obtained from hydrolysis of a bismuth alkoxide and a metal alkoxide is subjected to sintering processing, and wherein the resulting sintered material is subjected to dispersion and coating. However, with the aforesaid technique for forming the photo-conductor layer, limitation is imposed upon a packing density of the photo-conductor substance in the photo-conductor layer which is capable of being formed with the coating. Also, the problems occur in that a binder, which is contained in the photo-conductor layer having been formed with the coating, has a large effect of obstructing the movements of the generated electric charges, electric noise becomes large, and therefore graininess characteristics of the obtained image are not capable of being kept good.

A process for producing a $Bi_{12}MO_{20}$ sintered material by use of a solid phase technique is described in, for example, each of J. Am. Ceram. Soc. 84, 2900 (2001) to "Processing and Dielectric Properties of Sillenite Compounds $Bi_{12}MO_{20-\delta}$ (M=Si, Ge, Ti, Pb, Mn, $B_{1/2}P_{1/2}$)", by M. Valant and D. Suvorov, J. Am. Ceram. Soc., Vol. 84, pp. 2900-2904, 2001 and Ceramic Bulletin 58, 613 (1979)to "Sintering of an X-Ray Photosensitive Ceramic: $Bi_{12}GeO_{20}$", by A. Morell and A. Hermosin, Ceramic Bulletin Vol. 58, pp. 613-615, 1979. The $Bi_{12}MO_{20}$ sintered material, which is obtained with the sintering processing, has the advantages over the photo-conductor layer, which is formed with the coating, in that the packing density of the photo-conductor substance in the photo-conductor layer is capable of being enhanced because of a dense structure, and therefore the sensitivity of the photo-conductor layer is capable of being enhanced. However, with the process for producing a $Bi_{12}MO_{20}$ sintered material by use of a solid phase technique, which process is described in each of J. Am. Ceram. Soc. 84, 2900 (2001) and Ceramic Bulletin 58, 613 (1979), though the packing density of the photo-conductor substance in the photo-conductor layer is capable of being kept higher than the packing density of the photo-conductor substance in the photo-conductor layer having been formed with the coating, the sensitivity is not always capable of being enhanced to an expected level.

In the field of ceramic materials, it has been found that the state of oxidation of an oxide is determined by an oxygen partial pressure, and that the oxygen concentration in the atmosphere is determined by a ratio of a CO gas to a $CO_2$ gas. (The aforesaid findings are described in, for example, "Handbook of Ceramics", Second Edition, edited by The Ceramic Society of Japan, pp. 423-426.) Also, in "Handbook of Ceramics" there is a description concerning a technique for controlling the oxygen partial pressure by use of a gas, which contains an $N_2$ gas as a principal constituent and which contains at least one kind of gas selected from the group consisting of $H_2$, $H_2O$, $CO_2$, and CO, in a sintering step for a laminated ceramic condenser.

The inventors have conducted extensive research concerning the conditions for the production of a $Bi_{12}MO_{20}$ sintered material and found that a $Bi_{12}MO_{20}$ sintered material, which is free from defects obstructing the movements of electric charges, is capable of being obtained, and that a radiation imaging panel having a high sensitivity is capable of being obtained by use of the aforesaid defect-free $Bi_{12}MO_{20}$ sintered material for the photo-conductor layer.

SUMMARY OF THE INVENTION

The primary object of the present invention is to provide a novel process for producing a photo-conductor layer containing a bismuth oxide type of a composite oxide.

Another object of the present invention is to provide a process for producing a photo-conductor layer, which is free from crystal defects.

The present invention provides a first process for producing a photo-conductor layer for constituting a radiation imaging panel, which photo-conductor layer is capable of recording radiation image information as an electrostatic latent image, the photo-conductor layer containing a $Bi_{12}MO_{20}$ sintered material, in which M represents at least one kind of element selected from the group consisting of Ge, Si, and Ti, the process comprising the step of:

performing sintering processing for the formation of the $Bi_{12}MO_{20}$ sintered material in an inert gas atmosphere.

The term "inert gas" as used herein means an $N_2$ gas or a rare gas (a helium gas or an argon gas). The first process for producing a photo-conductor layer in accordance with the present invention should preferably be modified such that the inert gas is a rare gas. The term "inert gas atmosphere" as used herein means the atmosphere, which contains the $N_2$ gas, the rare gas, or a mixture of the $N_2$ gas and the rare gas. The inert gas atmosphere may also contain the other atmospheric gas, such as an oxygen gas, to an extent such that crystal defects may not be caused to occur in the sintering reaction for the production of the $Bi_{12}MO_{20}$ sintered material. In particular, the first process for producing a photo-conductor layer in accordance with the present invention should preferably be modified such that an oxygen partial pressure in the inert gas atmosphere falls within the range of $1 \times 10^{-5}$ Pa to 20 Pa. The sintering processing may be performed in a sintering furnace which uses a metal muffle. In the present specification, a "muffle" is a device that shields a sintering space. The muffle is formed by a material that has high thermal resistance and high thermal conductivity. In the present invention, it is preferable that a muffle formed by metal is employed, when performing sintering.

The present invention also provides a second process for producing a photo-conductor layer for constituting a radiation imaging panel, which photo-conductor layer is capable of recording radiation image information as an electrostatic latent image, the photo-conductor layer containing a $Bi_{12}MO_{20}$ sintered material, in which M represents at least one kind of element selected from the group consisting of Ge, Si, and Ti, the process comprising the step of:

performing sintering processing for the formation of the $Bi_{12}MO_{20}$ sintered material at a sintering temperature falling within the range of 800° C. to 900° C. and in an atmosphere, in which an oxygen partial pressure $P_{O2}$ (Pa) satisfies the condition $10^{-3} \leq P_{O2} \leq 10^{-1}$.

The second process for producing a photo-conductor layer in accordance with the present invention should preferably be modified such that the sintering processing is performed in the atmosphere, such that a ratio of a carbon monoxide partial pressure $P_{CO}$ to a carbon dioxide partial pressure $P_{CO2}$ satisfies the condition $10^{-6} \leq P_{CO}/P_{CO2} \leq 10^{-4}$.

With the first process for producing a photo-conductor layer for constituting a radiation imaging panel in accordance with the present invention, the photo-conductor layer, which is capable of recording the radiation image information as the electrostatic latent image, is produced. The photo-conductor layer contains the $Bi_{12}MO_{20}$ sintered material, in which M represents at least one kind of element selected from the group consisting of Ge, Si, and Ti. With the first process for producing a photo-conductor layer for constituting a radiation imaging panel in accordance with the present invention, the sintering processing for the formation of the $Bi_{12}MO_{20}$ sintered material is performed in the inert gas atmosphere. Therefore, the $Bi_{12}MO_{20}$ sintered material having been obtained with the first process for producing a photo-conductor layer in accordance with the present invention has the advantages over the $Bi_{12}MO_{20}$ sintered material, which is obtained with the conventional sintering processing, in that the $Bi_{12}MO_{20}$ sintered material having been obtained with the first process for producing a photo-conductor layer in accordance with the present invention is free from crystal defects. Accordingly, in cases where the aforesaid defect-free $Bi_{12}MO_{20}$ sintered material is utilized for constituting the photo-conductor layer, a radiation imaging panel having a high sensitivity is capable of being obtained.

With the second process for producing a photo-conductor layer for constituting a radiation imaging panel in accordance with the present invention, the photo-conductor layer, which is capable of recording the radiation image information as the electrostatic latent image, is produced. The photo-conductor layer contains the $Bi_{12}MO_{20}$ sintered material, in which M represents at least one kind of element selected from the group consisting of Ge, Si, and Ti. With the second process for producing a photo-conductor layer for constituting a radiation imaging panel in accordance with the present invention, the sintering processing for the formation of the $Bi_{12}MO_{20}$ sintered material is performed at the sintering temperature falling within the range of 800° C. to 900° C. and in the atmosphere, in which the oxygen partial pressure $P_{O2}$ (Pa) satisfies the condition $10^{-1} \leq P_{O2} \leq 10^{-1}$. Therefore, the $Bi_{12}MO_{20}$ sintered material having been obtained with the second process for producing a photo-conductor layer in accordance with the present invention has the advantages over the $Bi_{12}MO_{20}$ sintered material, which is obtained with the conventional sintering processing, in that the $Bi_{12}MO_{20}$ sintered material having been obtained with the second process for producing a photo-conductor layer in accordance with the present invention is free from crystal defects. Accordingly, in cases where the aforesaid defect-free $Bi_{12}MO_{20}$ sintered material is utilized for constituting the photo-conductor layer, a radiation imaging panel having a high sensitivity is capable of being obtained.

With the second process for producing a photo-conductor layer in accordance with the present invention, wherein the sintering processing is performed in the atmosphere, such that the ratio of the carbon monoxide partial pressure $P_{CO}$ to the carbon dioxide partial pressure $P_{CO2}$ satisfies the condition $10^{-6} \leq P_{CO}/P_{CO2} \leq 10^{-4}$, the oxidation represented by the formula $Bi^{3+} \rightarrow Bi^{5+}$ is capable of being suppressed even further. Therefore, the $Bi_{12}MO_{20}$ sintered material free from crystal defects is capable of being obtained.

The present invention will hereinbelow be described in further detail with reference to the accompanying drawings.

DETAILED DESCRIPTION OF THE INVENTION

Figure 1:
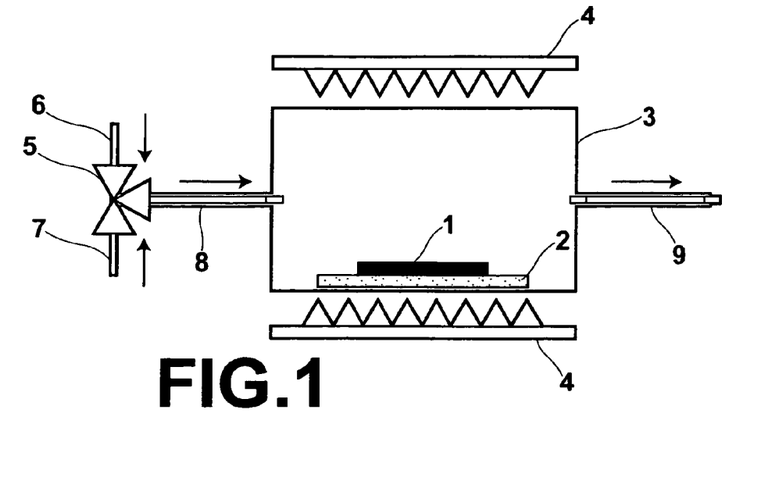
FIG. 1 is a schematic sectional view showing an apparatus for producing a $Bi_{12}MO_{20}$ sintered material with the first process for producing a photo-conductor layer in accordance with the present invention.

With the first process for producing a photo-conductor layer for constituting a radiation imaging panel in accordance with the present invention, the photo-conductor layer, which is capable of recording the radiation image information as the electrostatic latent image, is produced. The photo-conductor layer contains the $Bi_{12}MO_{20}$ sintered material, in which M represents at least one kind of element selected from the group consisting of Ge, Si, and Ti. The first process for producing a photo-conductor layer for constituting a radiation imaging panel in accordance with the present invention comprises the step of: performing the sintering processing for the formation of the $Bi_{12}MO_{20}$ sintered material in the inert gas atmosphere. FIG. 1 is a schematic sectional view showing an apparatus for producing a $Bi_{12}MO_{20}$ sintered material with the first process for producing a photo-conductor layer in accordance with the present invention.

With reference to FIG. 1, the apparatus for producing a $Bi_{12}MO_{20}$ sintered material with the first process for producing a photo-conductor layer in accordance with the present invention comprises a sintering furnace 3 provided with a setter 2 for supporting a $Bi_{12}MO_{20}$ molded material 1 thereon. The apparatus also comprises heaters 4, 4, which are located above and below the sintering furnace 3. The apparatus further comprises a flow path 8, through which air or an inert gas is to be introduced into the sintering furnace 3. The apparatus still further comprises a flow path 9, through which the air or the inert gas is to be discharged from the sintering furnace 3. A three-way valve 5 is connected to one end of the flow path 8, which end is other than the end connected to the sintering furnace 3. The three-way valve 5 is also connected to a flow path 6, through which the air is to be introduced, and a flow path 7, through which the inert gas is to be introduced. The sintering furnace 3 should preferably be a sintering furnace which uses a metal muffle. In cases where the sintering furnace which uses a metal muffle is utilized, the oxygen partial pressure is capable of being suppressed even further. Especially when it is difficult to achieve the oxygen partial pressure of $10^{-3}$ Pa, which is the lowest partial pressure of trace oxygen included as an impurity in the inert gas, if the sintering furnace which uses the metal muffle is utilized, it is possible to easily achieve an oxygen partial pressure in the vicinity of the lowest partial pressure.

The $Bi_{12}MO_{20}$ molded material 1 is a planar molded material before being subjected to the sintering processing for the formation of the $Bi_{12}MO_{20}$ sintered material. (After the planar molded material has been subjected to the sintering processing, the resulting sintered material is utilized as the photo-conductor layer.) The $Bi_{12}MO_{20}$ molded material 1 is obtained from the processing, wherein bismuth oxide particles and the particles, which are selected from the group consisting of silicon oxide particles, germanium oxide particles, and the titanium oxide particles, are mixed together, wherein the resulting mixture is subjected to preliminary firing, and wherein the thus obtained $Bi_{12}MO_{20}$ particles are molded with a molding technique, such as a press molding technique or a doctor blade technique.

A procedure for the sintering processing of the $Bi_{12}MO_{20}$ molded material 1 will be described hereinbelow with reference to FIG. 1.

Specifically, after the $Bi_{12}MO_{20}$ molded material 1 has been supported on the setter 2, the three-way valve 5 is set such that the flow path 6 and the flow path 8 communicate with each other, and air is introduced into the sintering furnace 3. Also, the temperature within the sintering furnace 3 is raised by use of the heaters 4, 4, and a binder contained in the $Bi_{12}MO_{20}$ molded material 1 is thus decomposed or burned. After the binder contained in the $Bi_{12}MO_{20}$ molded material 1 has thus been removed, the air is discharged from the sintering furnace 3 through the flow path 9. Further, the three-way valve 5 is set such that the flow path 7 and the flow path 8 communicate with each other, and the inert gas is introduced into the sintering furnace 3. After the inert gas atmosphere has thus been formed within the sintering furnace 3, the temperature within the sintering furnace 3 is raised even further by use of the heaters 4, 4, and the $Bi_{12}MO_{20}$ molded material 1 is thereby sintered.

The sintering temperature may vary in accordance with the kind of the material to be sintered, the kind of the setter 2, the combination of the material to be sintered and the setter 2, and the like. However, the sintering temperature should preferably fall within the range of 800° C. to 900° C. The temperature, at which the binder removal is performed, should preferably fall within the range of 200° C. to 700° C.

If the oxygen concentration is too high at the time of the sintering processing, Bi contained in $Bi_{12}MO_{20}$ will undergo the oxidation represented by the formula $Bi^{3+} \rightarrow Bi^{5+}$, and crystal defects will thus occur in the $Bi_{12}MO_{20}$ sintered material. If the $Bi_{12}MO_{20}$ sintered material having the crystal defects is utilized as the photo-conductor layer for constituting the radiation imaging panel, the problems will occur in that the movements of carriers, such as photo-electrons and photo positive holes, are obstructed, and the sensitivity becomes low. If the oxygen concentration is too low at the time of the sintering processing, Bi contained in $Bi_{12}MO_{20}$ will undergo the reduction represented by the formula $Bi^{3+} \rightarrow Bi$, and crystal defects will thus occur in the $Bi_{12}MO_{20}$ sintered material. If the $Bi_{12}MO_{20}$ sintered material having the crystal defects is utilized as the photo-conductor layer for constituting the radiation imaging panel, the problems will occur in that the movements of carriers, such as photo-electrons and photo positive holes, are obstructed, and the sensitivity becomes low. However, with the first process for producing a photo-conductor layer containing the $Bi_{12}MO_{20}$ sintered material in accordance with the present invention, the sintering processing for the formation of the $Bi_{12}MO_{20}$ sintered material is performed in the inert gas atmosphere. Therefore, with the first process for producing a photo-conductor layer in accordance with the present invention, the oxidation represented by the formula $Bi^{3+} \rightarrow Bi^{5+}$ is capable of being suppressed. Also, the reduction represented by the formula $Bi^{3+} \rightarrow Bi$ is capable of being suppressed. Accordingly, the $Bi_{12}MO_{20}$ sintered material free from crystal defects is capable of being produced. As a result, a photo-conductor layer having a high sensitivity is capable of being obtained.

Particularly, in cases where the oxygen partial pressure in the inert gas atmosphere falls within the range of $1 \times 10^{-5}$ Pa to 20 Pa, the oxidation represented by the formula $Bi^{3+} \rightarrow Bi^{5+}$ and the reduction represented by the formula $Bi^{3+} \rightarrow Bi$ are capable of being suppressed efficiently. Accordingly, a photo-conductor layer (a sintered material) having a high sensitivity is capable of being obtained.

Figure 2:
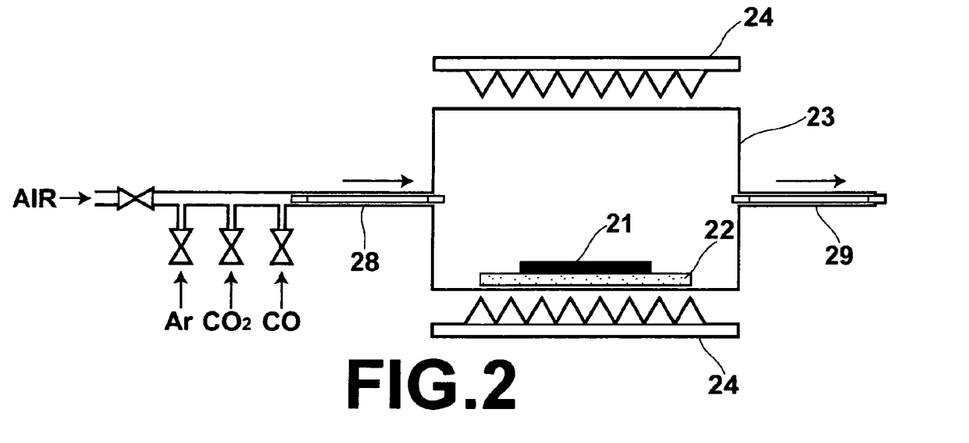
FIG. 2 is a schematic sectional view showing an apparatus for producing a $Bi_{12}MO_{20}$ sintered material with the second process for producing a photo-conductor layer in accordance with the present invention.

With the second process for producing a photo-conductor layer for constituting a radiation imaging panel in accordance with the present invention, the photo-conductor layer, which is capable of recording the radiation image information as the electrostatic latent image, is produced. The photo-conductor layer contains the $Bi_{12}MO_{20}$ sintered material, in which M represents at least one kind of element selected from the group consisting of Ge, Si, and Ti. The second process for producing a photo-conductor layer for constituting a radiation imaging panel in accordance with the present invention comprises the step of: performing the sintering processing for the formation of the $B_{12}MO_{20}$ sintered material at the sintering temperature falling within the range of 800° C. to 900° C. and in the atmosphere, in which the oxygen partial pressure $P_{O2}$ (Pa) satisfies the condition $10^{-3} \leq P_{O2} \leq 10^{-1}$. FIG. 2 is a schematic sectional view showing an apparatus for producing a $Bi_{12}MO_{20}$ sintered material with the second process for producing a photo-conductor layer in accordance with the present invention.

With reference to FIG. 2, the apparatus for producing a $Bi_{12}MO_{20}$ sintered material with the second process for producing a photo-conductor layer in accordance with the present invention comprises a sintering furnace 23 provided with a setter 22 for supporting a $Bi_{12}MO_{20}$ molded material 21 thereon. The apparatus also comprises heaters 24, 24, which are located above and below the sintering furnace 23. The apparatus further comprises a flow path 28, through which air, an inert gas, a $CO_2$ gas, and a CO gas are to be introduced into the sintering furnace 23. The apparatus still further comprises a flow path 29, through which the air, the inert gas, and the like, are to be discharged from the sintering furnace 23. A gas supplying section is connected to one end of the flow path 28, which end is other than the end connected to the sintering furnace 23. The gas supplying section introduces the air, the inert gas (in this case, an Ar gas), the $CO_2$ gas, and the CO gas into the sintering furnace 23.

The $Bi_{12}MO_{20}$ molded material 21 is a planar molded material before being subjected to the sintering processing for the formation of the $Bi_{12}MO_{20}$ sintered material. (After the planar molded material has been subjected to the sintering processing, the resulting sintered material is utilized as the photo-conductor layer.) The $Bi_{12}MO_{20}$ molded material 21 is obtained from the processing, wherein bismuth oxide particles and the particles, which are selected from the group consisting of silicon oxide particles, germanium oxide particles, and the titanium oxide particles, are mixed together, wherein the resulting mixture is subjected to preliminary firing, and wherein the thus obtained $Bi_{12}MO_{20}$ particles are molded with a molding technique, such as a press molding technique or a doctor blade technique.

A procedure for the sintering processing of the $Bi_{12}MO_{20}$ molded material 21 will be described hereinbelow with reference to FIG. 2.

Specifically, after the $Bi_{12}MO_{20}$ molded material 21 has been supported on the setter 22, air is introduced through the flow path 28 into the sintering furnace 23. Also, the temperature within the sintering furnace 23 is raised by use of the heaters 24, 24, the $Bi_{12}MO_{20}$ molded material 21 is dried, and a binder contained in the $Bi_{12}MO_{20}$ molded material 21 is thus evaporated. After the binder contained in the $Bi_{12}MO_{20}$ molded material 21 has thus been removed, the air is discharged from the sintering furnace 23 through the flowpath 29. Further, at the gas supplying section, valves for introducing the Ar gas, the $CO_2$ gas, and the CO gas into the sintering furnace 23, are opened. The Ar gas, the $CO_2$ gas, and the CO gas are thus introduced through the flow path 28 into the sintering furnace 23. The gas supplying section is constituted such that each of the flow rates is capable of being controlled with a mass flow meter. The multiple kinds of the gases are introduced into the sintering furnace 23 via a gas mixing device (not shown), which is associated with the flow path 28.

After the mixed gas atmosphere, which contains the Ar gas, the $CO_2$ gas, and the CO gas, has thus been formed within the sintering furnace 23, the flow path 29 is closed, and the temperature within the sintering furnace 23 is raised even further by use of the heaters 24, 24. The $Bi_{12}MO_{20}$ molded material 21 is thereby sintered at a sintering temperature falling within the range of 800° C. to 900° C. The temperature, at which the binder removal is performed, may vary in accordance with the kind of the material to be sintered, the kind of the setter 22, the combination of the material to be sintered and the setter 22, and the like. However, the temperature, at which the binder removal is performed, should preferably fall within the range of 200° C. to 700° C.

If the oxygen partial pressure is markedly high at the time of the sintering processing, Bi contained in $Bi_{12}MO_{20}$ will undergo the oxidation represented by the formula $Bi^{3+} \rightarrow Bi^{5+}$, and crystal defects will thus occur in the $Bi_{12}MO_{20}$ sintered material. If the $Bi_{12}MO_{20}$ sintered material having the crystal defects is utilized as the photo-conductor layer for constituting the radiation imaging panel, the problems will occur in that the reflectivity becomes low, and the sensitivity becomes low. If the oxygen partial pressure is markedly low at the time of the sintering processing, Bi contained in $Bi_{12}MO_{20}$ will undergo the reduction represented by the formula $Bi^{3+} \rightarrow Bi$, and crystal defects will thus occur in the $Bi_{12}MO_{20}$ sintered material. If the $Bi_{12\ MO20}$ sintered material having the crystal defects is utilized as the photo-conductor layer for constituting the radiation imaging panel, the problems will occur in that the sensitivity becomes low. However, with the second process for producing a photo-conductor layer containing the $Bi_{12}MO_{20}$ sintered material in accordance with the present invention, the sintering processing for the formation of the $Bi_{12}MO_{20}$ sintered material is performed in the atmosphere, in which the oxygen partial pressure $P_{O2}$ satisfies the condition $10^{-8} \leq P_{O2} \leq 10^{-6}$. Therefore, with the second process for producing a photo-conductor layer in accordance with the present invention, the oxidation represented by the formula $Bi^{3+} \rightarrow Bi^{5+}$ is capable of being suppressed. Also, the reduction represented by the formula $Bi^{3+} \rightarrow Bi$ is capable of being suppressed. Accordingly, the $Bi_{12}MO_{20}$ sintered material free from crystal defects is capable of being produced.

Also, with the second process for producing a photo-conductor layer in accordance with the present invention, in cases where the sintering processing is performed in the atmosphere, such that the ratio of the carbon monoxide partial pressure $P_{CO}$ to the carbon dioxide partial pressure $P_{CO2}$ satisfies the condition $10^{-6} \leq P_{CO}/P_{CO2} \leq 10^{-4}$, the oxygen partial pressure is capable of being controlled easily with the reaction represented by the formula $CO + \frac{1}{2} O_2 \rightarrow CO_2$. Therefore, the oxidation represented by the formula $Bi^{3+} \rightarrow Bi^{5+}$ is capable of being suppressed even further. Accordingly, the $Bi_{12}MO_{20}$ sintered material free from crystal defects is capable of being obtained.

Radiation imaging panels, which are produced by use of the $Bi_{12}MO_{20}$ sintered material having been obtained with each of the first and second processes for producing a photo-conductor layer in accordance with the present invention, will be described hereinbelow.

Ordinarily, radiation imaging panels may be classified into a direct conversion type, in which the radiation energy is directly converted into electric charges, and the thus formed electric charges are accumulated, and an indirect conversion type, in which the radiation energy is converted into light by use of a scintillator, such as CsI, the thus obtained light is then converted into electric charges by use of a-Si photodiodes, and the thus formed electric charges are accumulated. The photo-conductor layer, which is produced with the process for producing a photo-conductor layer in accordance with the present invention, is employed for the direct conversion type of the radiation imaging panel. The photo-conductor layer, which is produced with the process for producing a photo-conductor layer in accordance with the present invention, may be employed for the radiation, such as X-rays, γ-rays, and α-rays.

The photo-conductor layer, which is produced with the process for producing a photo-conductor layer in accordance with the present invention, may be employed for an optical read-out technique, in which the read-out operation is performed by use of a radiation image detector utilizing a semi-conductor material capable of generating the electric charges when being exposed to light. The photo-conductor layer, which is produced with the process for producing a photo-conductor layer in accordance with the present invention, may also be employed for a TFT technique. With the TFT technique, the electric charges having been generated with the irradiation of the radiation are accumulated, and the accumulated electric charges are read through an operation, in which an electric switch, such as a thin film transistor (TFT), is turned on and off with respect to each of pixels.

Firstly, by way of example, the radiation imaging panel employed for the optical read-out technique will be described hereinbelow.

Figure 3:
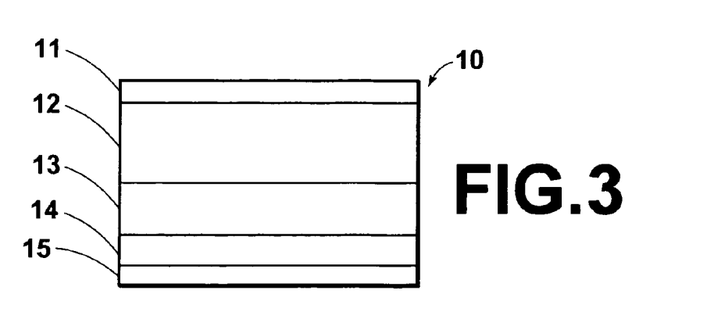
FIG. 3 is a sectional view showing an example of a radiation imaging panel, which comprises a photo-conductor layer produced with the process for producing a photo-conductor layer in accordance with the present invention.

FIG. 3 is a sectional view showing an example of a radiation imaging panel, which comprises a photo-conductor layer produced with the process for producing a photo-conductor layer in accordance with the present invention.

With reference to FIG. 3, a radiation imaging panel 10 comprises a first electrically conductive layer 11, which has transmissivity to recording radiation L1 described later. The radiation imaging panel 10 also comprises a recording radio-conductive layer 12, which exhibits electrical conductivity when it is exposed to the radiation L1 having passed through the first electrically conductive layer 11. The radiation imaging panel 10 further comprises a charge transporting layer 13, which acts approximately as an insulator with respect to electric charges (latent image polarity charges, e.g. negative charges) having a polarity identical with the polarity of electric charges occurring in the first electrically conductive layer 11, and which acts approximately as a conductor with respect to electric charges (transported polarity charges, positive charges in this example) having a polarity opposite to the polarity of the electric charges occurring in the first electrically conductive layer 11. The radiation imaging panel 10 still further comprises a reading photo-conductor layer 14, which exhibits electrical conductivity when it is exposed to reading light L2 described later, and a second electrically conductive layer 15 having transmissivity to the reading light L2. The first electrically conductive layer 11, the recording radio-conductive layer 12, the charge transporting layer 13, the reading photo-conductor layer 14, and the second electrically conductive layer 15 are overlaid in this order.

As each of the first electrically conductive layer 11 and the second electrically conductive layer 15, a film of an electrically conductive substance (tin dioxide film, or the like) uniformly coated on a transparent glass plate may be employed.

The charge transporting layer 13 may be constituted of one of various materials, which have the characteristics such that the difference between the mobility of the negative electric charges occurring in the first electrically conductive layer 11 and the mobility of the positive electric charges is large. The charge transporting layer 13 should preferably be constituted of, for example, an organic compound, such as a poly-N-vinylcarbazole (PVK), N,N'-diphenyl-N,N'-bis(3-methylphenyl)-[1,1'-biphenyl]-4,4'-diamine (TPD), or a disk-shaped liquid crystal; or a semiconductor substance, such as a polymer (polycarbonate, polystyrene, PVK) dispersion of TPD, or a-Se doped with 10 ppm to 200 ppm of Cl. In particular, the organic compound (PVK, TPD, or the disk-shaped liquid crystal) has light insensitivity and is therefore preferable. Also, since the permittivity is ordinarily low, the capacity of the charge transporting layer 13 and the capacity of the reading photo-conductor layer 14 become small, and the signal take-out efficiency at the time of readout is capable of being kept high.

The reading photo-conductor layer 14 should preferably be constituted of, for example, a photo-conductive material containing, as a principal constituent, at least one substance selected from the group consisting of a-Se, Se—Te, Se—As—Te, metal-free phthalocyanine, metallo-phthalocyanine, magnesium phthalocyanine (MgPc), phase II of vanadyl phthalocyanine (VoPc), and copper phthalocyanine (CuPc).

As the recording radio-conductive layer 12, the photo-conductor layer, which is constituted of a $Bi_{12}MO_{20}$ sintered film and is produced with the process for producing a photo-conductor layer in accordance with the present invention, is employed. Specifically, the photo-conductor layer, which is produced with the process for producing a photo-conductor layer in accordance with the present invention, is the recording radio-conductive layer.

The optical read-out technique for reading out the electrostatic latent image will hereinbelow be described briefly.

Figure 4:
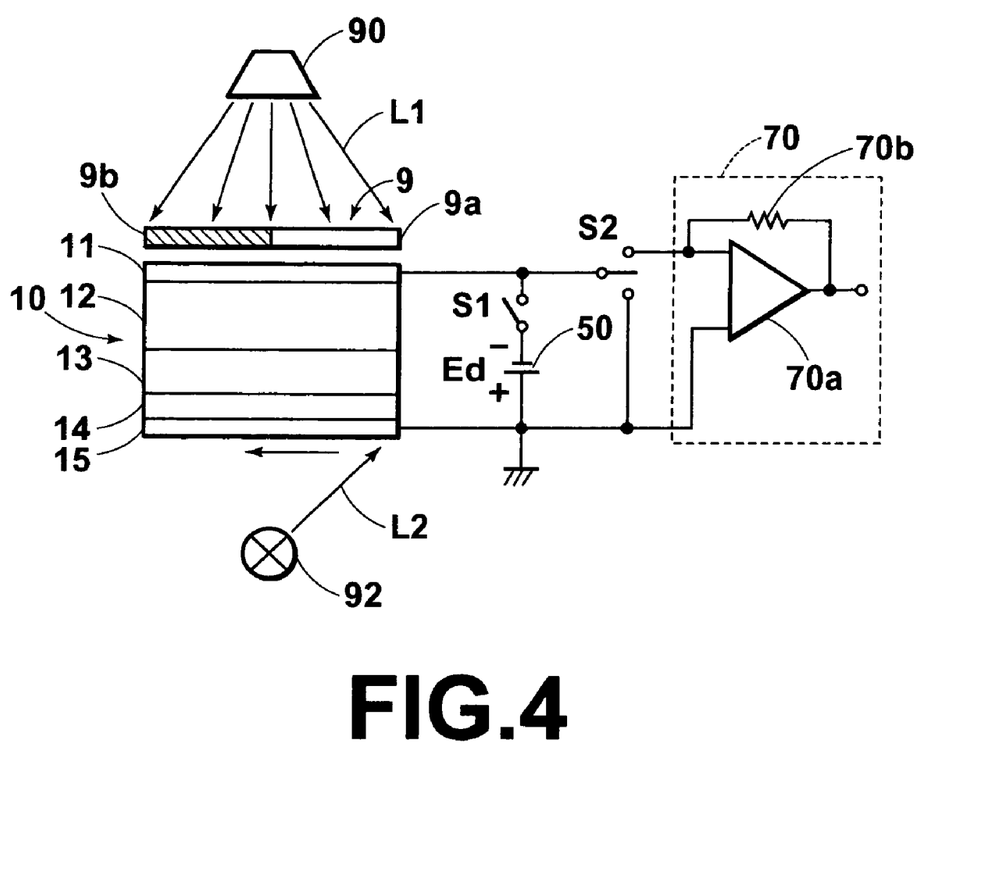
FIG. 4 is a schematic view showing a recording and read-out system, in which the radiation imaging panel of FIG. 3 is employed.

FIG. 4 is a schematic view showing a recording and read-out system (i.e., a combination of an electrostatic latent image recording apparatus and an electrostatic latent image read-out apparatus), in which the radiation imaging panel 10 of FIG. 3 is employed. With reference to FIG. 4, the recording and read-out system comprises the radiation imaging panel 10 and recording irradiation means 90. The recording and read-out system also comprises an electric power source 50 and electric current detecting means 70. The recording and readout system further comprises read-out exposure means 92, connection means S1, and connection means S2. The electrostatic latent image recording apparatus is constituted of the radiation imaging panel 10, the electric power source 50, the recording irradiation means 90, and the connection means S1. The electrostatic latent image read-out apparatus is constituted of the radiation imaging panel 10, the electric current detecting means 70, and the connection means S2.

The first electrically conductive layer 11 of the radiation imaging panel 10 is connected via the connection means S1 to a negative pole of the electric power source 50. The first electrically conductive layer 11 of the radiation imaging panel 10 is also connected to one end of the connection means S2. One terminal of the other end of the connection means S2 is connected to the electric current detecting means 70. The second electrically conductive layer 15 of the radiation imaging panel 10, a positive pole of the electric power source 50, and the other terminal of the other end of the connection means S2 are grounded. The electric current detecting means 70 comprises a detection amplifier 70a, which is constituted of an operational amplifier, and a feedback resistor 70b. The electric current detecting means 70 thus constitutes a current-to-voltage converting circuit.

An object 9 lies at the top surface of the first electrically conductive layer 11. The object 9 has a transmissive region 9a, which has the transmissivity to the radiation L1, and a light blocking region 9b, which does not have the transmissivity to the radiation L1. The recording irradiation means 90 uniformly irradiates the radiation L1 to the object 9. With the read-out exposure means 92, the reading light L2, such as an infrared laser beam, an LED light, or an EL light, is scanned in the direction indicated by the arrow in FIG. 4. The reading light L2 should preferably has a beam shape having been converged into a small beam diameter.

Figure 5A:
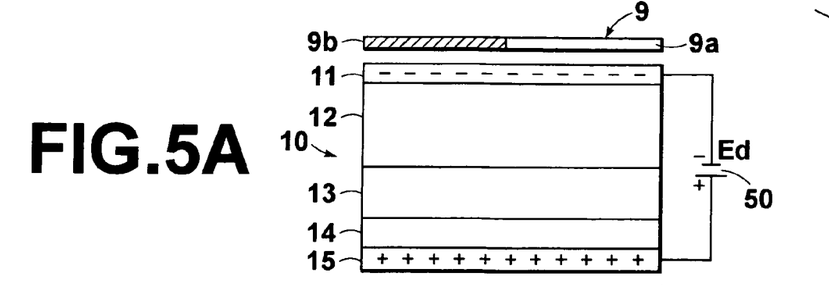
FIGS. 5A to 5D are explanatory views showing electric charge models for explanation of an electrostatic latent image recording stage in the recording and read-out system of FIG. 4, FIGS. 6A to 6D are explanatory views showing electric charge models for explanation of an electrostatic latent image read-out stage in the recording and read-out system of FIG. 4.

An electrostatic latent image recording stage in the recording and read-out system of FIG. 4 will be described hereinbelow with reference to FIGS. 5A to 5D. FIGS. 5A to 5D are explanatory views showing electric charge models for explanation of an electrostatic latent image recording stage in the recording and read-out system of FIG. 4. The connection means S2 illustrated in FIG. 4 is set in an open state (in which the connection means S2 is not connected to the ground nor to the electric current detecting means 70). Also, as illustrated in FIG. 5A, the connection means S1 illustrated in FIG. 4 is set in the on state, and a d.c. voltage Ed supplied by the electric power source 50 is applied between the first electrically conductive layer 11 and the second electrically conductive layer 15. As a result, the negative charges occur in the first electrically conductive layer 11, and the positive charges occur in the second electrically conductive layer 15. In this manner, a parallel electric field is formed between the first electrically conductive layer 11 and the second electrically conductive layer 15.

Figure 5B:
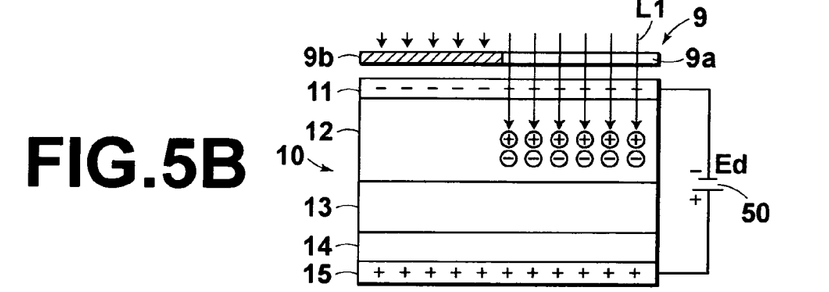

Thereafter, as illustrated in FIG. 5B, the radiation L1 is uniformly irradiated from the recording irradiation means 90 toward the object 9. The radiation L1, which has been produced by the recording irradiation means 90, passes through the transmissive region 9a of the object 9. The radiation L1 then passes through the first electrically conductive layer 11 and impinges upon the recording radio-conductive layer 12. When the recording radio-conductive layer 12 receives the radiation L1 having passed through the first electrically conductive layer 11, the recording radio-conductive layer 12 exhibits the electrical conductivity. The characteristics of the recording radio-conductive layer 12 for exhibiting the electrical conductivity are capable of being found from the characteristics in that the recording radio-conductive layer 12 acts as a variable resistor exhibiting a resistance value variable in accordance with the dose of the radiation L1. The resistance value depends upon the occurrence of electric charge pairs of electrons (negative charges) and holes (positive charges) due to the radiation L1. In cases where the dose of the radiation L1, which has passed through the object 9, is small, a large resistance value is exhibited. In FIG. 5B, the negative charges (−) formed by the radiation L1 are represented by "−" surrounded by the "○" mark, and the positive charges (+) formed by the radiation L1 are represented by "+" surrounded by the "○" mark.

Figure 5C:
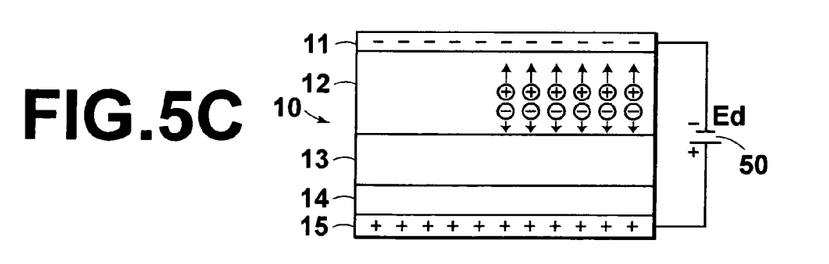
Figure 5D:
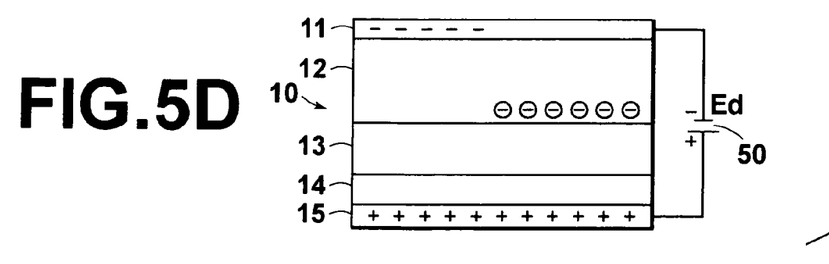

As illustrated in FIG. 5C, the positive charges, which have occurred in the recording radio-conductive layer 12, quickly migrate through the recording radio-conductive layer 12 toward the first electrically conductive layer 11. Also, as illustrated in FIG. 5D, the positive charges, which have migrated through the recording radio-conductive layer 12 toward the first electrically conductive layer 11, undergo charge re-combination with the negative charges, which have been formed in the first electrically conductive layer 11. The charge re-combination occurs at the interface between the first electrically conductive layer 11 and the recording radio-conductive layer 12, and the positive charges described above disappear.

Also, as illustrated in FIG. 5C, the negative charges, which have occurred in the recording radio-conductive layer 12, migrate through the recording radio-conductive layer 12 toward the charge transporting layer 13. The charge transporting layer 13 acts as the insulator with respect to the electric charges (in this example, the negative charges) having the polarity identical with the polarity of the electric charges occurring in the first electrically conductive layer 11. Therefore, as illustrated in FIG. 5D, the negative charges, which have migrated through the recording radio-conductive layer 12 toward the charge transporting layer 13, cease at the interface between the recording radio-conductive layer 12 and the charge transporting layer 13 and are accumulated at the interface between the recording radio-conductive layer 12 and the charge transporting layer 13. The quantity of the electric charges, which are thus accumulated, is defined by the quantity of the negative charges occurring in the recording radio-conductive layer 12, i.e. the dose of the radiation L1 having passed through the object 9.

The radiation L1 does not pass through the light blocking region 9b of the object 9. Therefore, as illustrated in FIGS. 5B, 5C, and 5D, a change does not occur at the region of the radiation imaging panel 10, which region is located under the light blocking region 9b of the object 9. In the manner described above, in cases where the radiation L1 is irradiated to the object 9, electric charges in accordance with the object image are capable of being accumulated at the interface between the recording radio-conductive layer 12 and the charge transporting layer 13. The object image, which is formed with the thus accumulated electric charges, is referred to as the electrostatic latent image.

Figure 6A:
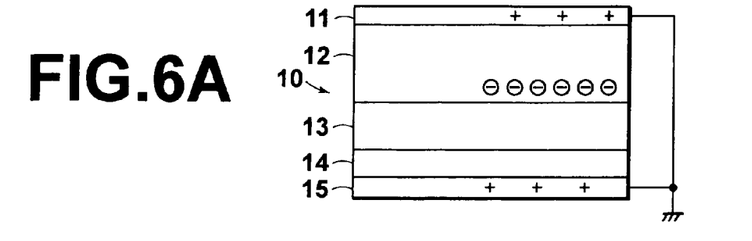

An electrostatic latent image read-out stage in the recording and read-out system of FIG. 4 will be described hereinbelow with reference to FIGS. 6A to 6D. FIGS. 6A to 6D are explanatory views showing electric charge models for explanation of an electrostatic latent image read-out stage in the recording and read-out system of FIG. 4. The connection means S1 illustrated in FIG. 4 is set in the open state, and the supply of the electric power is ceased. Also, as illustrated in FIG. 6A, the connection means S2 illustrated in FIG. 4 is connected to the ground side. In this manner, the first electrically conductive layer 11 and the second electrically conductive layer 15 of the radiation imaging panel 10, on which the electrostatic latent image has been recorded, are set at the identical electric potential, and re-arrangement of the electric charges is performed. Thereafter, the connection means S2 is connected to the side of the electric current detecting means 70.

Figure 6B:
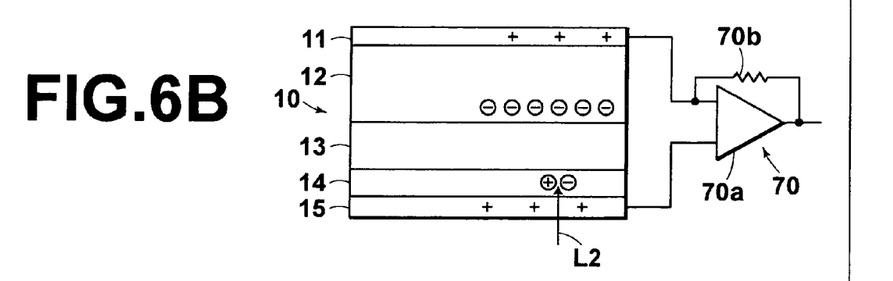

Also, as illustrated in FIG. 6B, with the read-out exposure means 92, the scanning with the reading light L2 is performed from the side of the second electrically conductive layer 15 of the radiation imaging panel 10. The reading light L2 impinging upon the second electrically conductive layer 15 passes through the second electrically conductive layer 15 and impinges upon the reading photo-conductor layer 14. When the reading photo-conductor layer 14 is exposed to the reading light L2, which has passed through the second electrically conductive layer 15, the reading photo-conductor layer 14 exhibits the electrical conductivity in accordance with the scanning exposure. As in the cases of the characteristics of the recording radio-conductive layer 12 for exhibiting the electrical conductivity due to the occurrence of the pairs of the positive and negative charges when the recording radio-conductive layer 12 is exposed to the radiation L1, the characteristics of the reading photo-conductor layer 14 for exhibiting the electrical conductivity depend upon the occurrence of the pairs of the positive and negative charges when the reading photo-conductor layer 14 is exposed to the reading light L2. As in the cases of the electrostatic latent image recording stage, in FIG. 6B, the negative charges (−) formed by the reading light L2 are represented by "−" surrounded by the "○" mark, and the positive charges (+) formed by the reading light L2 are represented by "+" surrounded by the "○" mark.

Figure 6C:
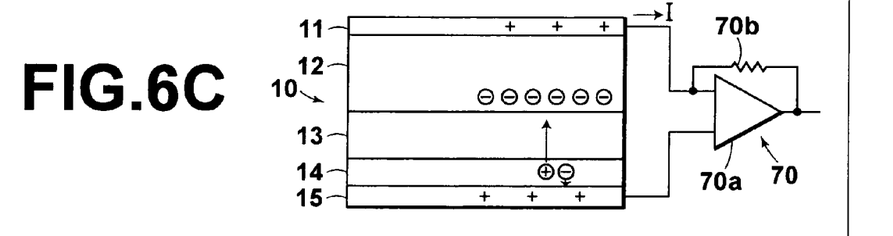
Figure 6D:
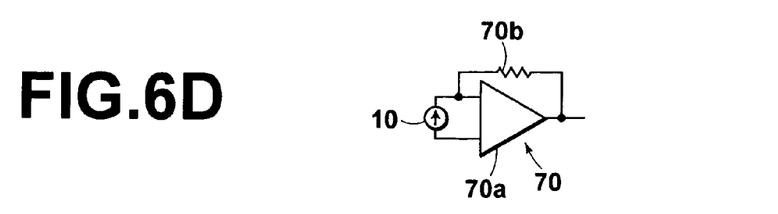

The charge transporting layer 13 acts as the electrical conductor with respect to the positive charges. Therefore, as illustrated in FIG. 6C, the positive charges, which have occurred in the reading photo-conductor layer 14, quickly migrate through the charge transporting layer 13 by being attracted by the negative charges, which have been accumulated at the interface between the recording radio-conductive layer 12 and the charge transporting layer 13. The positive charges, which have thus migrated through the charge transporting layer 13, undergo the charge re-combination with the accumulated negative charges at the interface between the recording radio-conductive layer 12 and the charge transporting layer 13 and disappear. Also, as illustrated in FIG. 6C, the negative charges, which have occurred in the reading photo-conductor layer 14, undergo the charge re-combination with the positive charges of the second electrically conductive layer 15 and disappear. The reading photo-conductor layer 14 is scanned with the reading light L2 having a sufficient optical intensity, and all of the accumulated electric charges, which have been accumulated at the interface between the recording radio-conductive layer 12 and the charge transporting layer 13, i.e. the electrostatic latent image, disappear through the charge re-combination. The disappearance of the electric charges, which have been accumulated in the radiation imaging panel 10, means the state, in which an electric current I flows across the radiation imaging panel 10 due to the migration of the electric charges. The state, in which the electric current I flows across the radiation imaging panel 10 due to the migration of the electric charges, is capable of being represented by an equivalent circuit illustrated in FIG. 6D, in which the radiation imaging panel 10 is represented by the electric current source having the electric current quantity depending upon the quantity of the accumulated electric charges.

As described above, the scanning of the radiation imaging panel 10 with the reading light L2 is performed, and the electric current flowing across the radiation imaging panel 10 is detected. In this manner, the quantity of the accumulated electric charges, which have been accumulated at each of scanned regions (corresponding to pixels), is capable of being detected. The electrostatic latent image is thus capable of being read out. The operations of the radiation detecting section are described in, for example, Japanese Unexamined Patent Publication No. 2000-105297.

Figure 7:
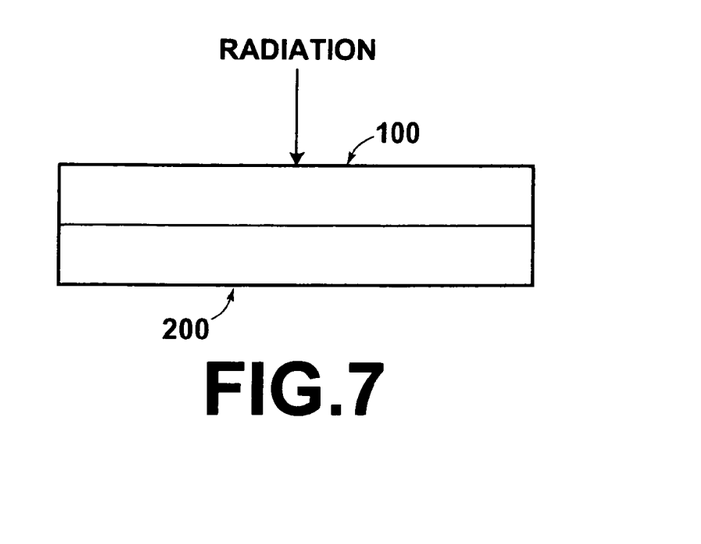
FIG. 7 is an explanatory view showing a radiation detector and an AMA board, which are combined together.
Figure 8:
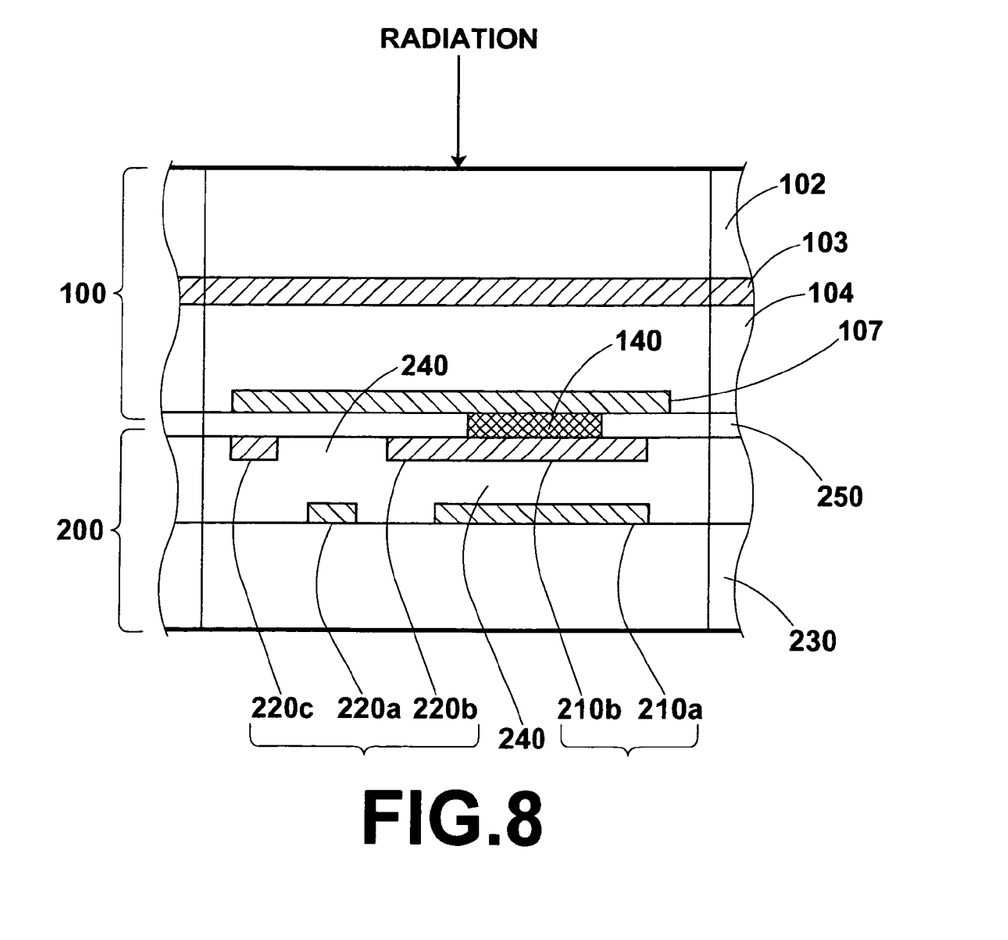
FIG. 8 is an electric circuit diagram showing an equivalent circuit of the AMA board.

The TFT type of the radiation imaging panel will be described hereinbelow. As illustrated in FIG. 7, the TFT type of the radiation imaging panel has a structure, in which a radiation detecting section 100 and an active matrix array board (AMA board) 200 has been joined together. As illustrated in FIG. 8, the radiation detecting section 100 comprises a common electrode 103 for application of a bias voltage. The radiation detecting section 100 also comprises a photo-conductor layer 104, which is sensitive to the radiation to be detected and forms carriers constituted of electron-hole pairs. The radiation detecting section 100 further comprises a detection electrode 107 for collecting the carriers. The common electrode 103, the photo-conductor layer 104, and the detection electrode 107 are overlaid in this order from the radiation incidence side. A radiation detecting section support 102 may be located as a top layer on the common electrode 103.

The photo-conductor layer 104 is the photo-conductor layer produced with the process for producing a photo-conductor layer in accordance with the present invention. Each of the common electrode 103 and the detection electrode 107 may be constituted of an electrically conductive material, such as indium tin oxide (ITO), Au, or Pt. In accordance with the polarity of the bias voltage, a hole injection blocking layer or an electron injection blocking layer may be appended to the common electrode 103 or the detection electrode 107.

Figure 9:
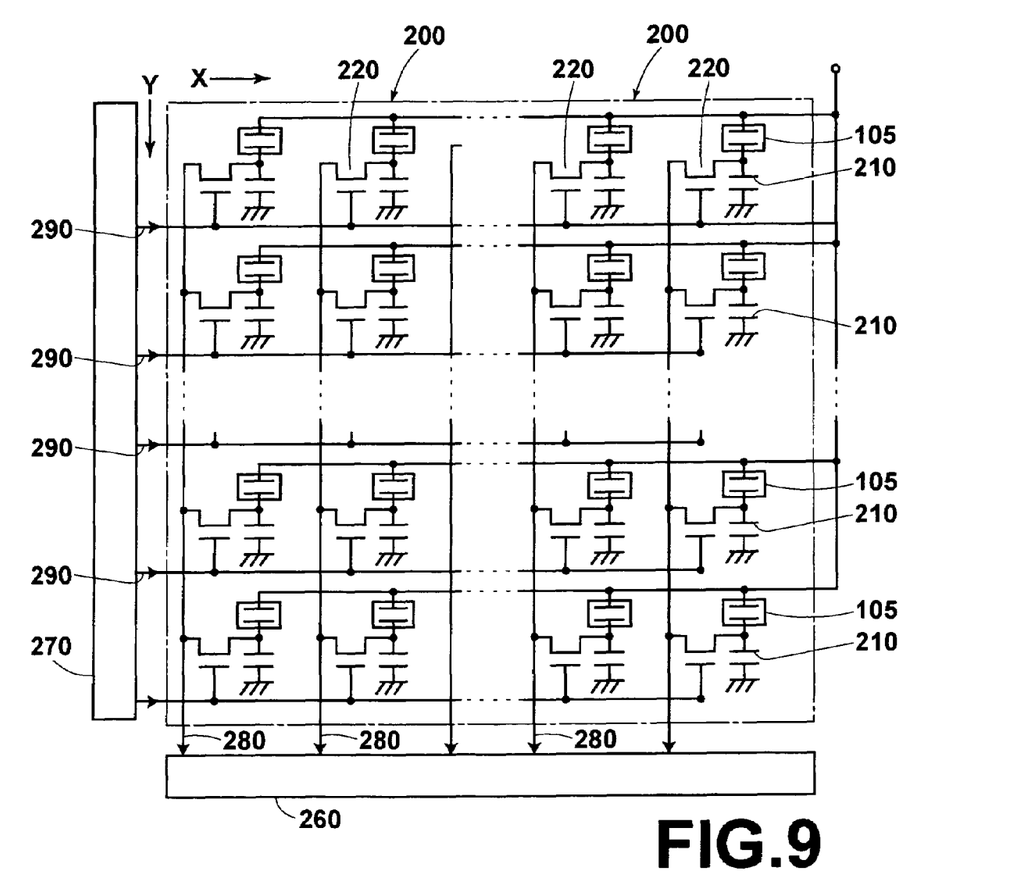
FIG. 9 is a sectional view showing a constitution at each of radiation detecting sections, each of which corresponds to one pixel.

The constitution of the AMA board 200 will hereinbelow be described briefly. As illustrated in FIG. 9, the AMA board 200 comprises capacitors 210, 210, . . . acting as charge accumulating capacitors and TFT's 220, 220, . . . acting as switching devices. One capacitor 210 and one TFT 220 are located for each of radiation detecting sections 105, 105, . . . , which correspond respectively to the pixels. On the radiation detecting section support 102, in accordance with the necessary pixels, the radiation detecting sections 105, 105, . . . , corresponding to the pixels are arrayed in two-dimensional directions in a pattern of a matrix comprising approximately 1,000~3,000 rows×1,000~3,000 columns. Also, the AMA board 200 comprises the same number of the combinations of the capacitor 210 and the TFT 220 as the number of the pixels are arrayed in two-dimensional directions in the same matrix patter as that described above. The electric charges, which have occurred in the photo-conductor layer 104, are accumulated in each of the capacitors 210, 210, . . . and act as the electrostatic latent image corresponding to the optical read-out technique. With the TFT technique, the electrostatic latent image having been formed with the radiation is kept at the charge accumulating capacitors.

The specific constitutions of each of the capacitors 210, 210, . . . and each of the TFT's 220, 220, . . . of the AMA board 200 are illustrated in FIG. 8. Specifically, an AMA board substrate 230 is constituted of an electrical insulator. A grounding side electrode 210a of the capacitor 210 and a gate electrode 220a of the TFT 220 are formed on the surface of the AMA board substrate 230. Above the grounding side electrode 210a of the capacitor 210 and the gate electrode 220a of the TFT 220, a connection side electrode 210b of the capacitor 210 is formed via an insulating film 240. Also, above the grounding side electrode 210a of the capacitor 210 and the gate electrode 220a of the TFT 220, a source electrode 220b and a drain electrode 220c of the TFT 220 are formed via the insulating film 240. Further, the top surface of the AMA board 200 is covered with a protective insulating film 250. The connection side electrode 210b of the capacitor 210 and the source electrode 220b of the TFT 220 are connected with each other and are formed together with each other. The insulating film 240 constitutes both the capacitor insulating film of the capacitor 210 and the gate insulating film of the TFT 220. The insulating film 240 may be constituted of, for example, a plasma SiN film. The AMA board 200 may be produced by use of a thin film forming technique or a fine processing technique, which is ordinarily employed for the production of a liquid crystal display board.

The joining of the radiation detecting section 100 and the AMA board 200 will be described herein below. Specifically, the position of the detection electrode 107 and the position of the connection side electrode 210b of the capacitor 210 are matched with each other. In this state, the radiation detecting section 100 and the AMA board 200 are laminated together by adhesion under heating and under pressure with an anisotropic electrically conductive film (ACF) intervening therebetween. The ACF contains electrically conductive particles, such as silver particles, and has the electrical conductivity only in the thickness direction. In this manner, the radiation detecting section 100 and the AMA board 200 are mechanically combined with each other. At the same time, the detection electrode 107 and the connection side electrode 210b are electrically connected with each other by an intervening conductor section 140.

Also, the AMA board 200 is provided with a read-out actuating circuit 260 and a gate actuating circuit 270. As illustrated in FIG. 9, the read-out actuating circuit 260 is connected to each of read-out wiring lines (read-out address lines) 280, 280, .... Each of the read-out wiring lines 280, 280, ... extends in the vertical (Y) direction and connects the drain electrodes 220c, 220c, ... of the TFT's 220, 220, ..., which are arrayed along an identical column. The gate actuating circuit 270 is connected to each of read-out wiring lines (gate address lines) 290, 290, .... Each of the read-out wiring lines 290, 290, ... extends in the horizontal (X) direction and connects the gate electrodes 220a, 220a, ... of the TFT's 220, 220, ..., which are arrayed along an identical row. Though not shown, in the read-out actuating circuit 260, one preamplifier (one electric charge-to-voltage converter) is connected to each of the read-out wiring lines 280, 280, .... In this manner, the AMA board 200 is connected to the read-out actuating circuit 260 and the gate actuating circuit 270. Alternatively, the read-out actuating circuit 260 and the gate actuating circuit 270 maybe formed into an integral body within the AMA board 200.

The radiation detecting operations performed by the radiation image recording and read-out system, which comprises the radiation detecting section 100 and the AMA board 200 joined together, are described in, for example, Japanese Unexamined Patent Publication No. 11 (1999)-287862.

The present invention will further be illustrated by the following non-limitative examples. Examples I are the examples of the first process for producing a photo-conductor layer for constituting a radiation imaging panel in accordance with the present invention. Examples II are the examples of the second process for producing a photo-conductor layer for constituting a radiation imaging panel in accordance with the present invention.

EXAMPLES

Examples I

Example 1

Bismuth oxide ($Bi_2O_3$) particles and titanium oxide ($TiO_2$) particles were mixed together in a molar ratio of 6:1. The resulting mixture was then subjected to ball mill mixing processing in ethanol by use of zirconium oxide balls. The mixture having been subjected to the ball mill mixing processing was recovered and dried. Thereafter, the mixture was subjected to preliminary firing processing at a temperature of 800° C. for eight hours. In this manner, $Bi_{12}TiO_{20}$ particles were obtained from the solid phase reaction of bismuth oxide and titanium oxide. The thus obtained $Bi_{12}TiO_{20}$ particles were then coarsely ground by use of a mortar, and the particles having a particle diameter of at most 150 μm were thus obtained. The $Bi_{12}TiO_{20}$ particles having thus been obtained were then subjected to grinding and dispersing processing in ethanol with a ball mill by use of zirconium oxide balls. At the time of the grinding and dispersing processing, 0.4 wt % of a polyvinyl butyral (PVB) was added as a dispersing agent for promoting the dispersing. Thereafter, 3.7 wt % of PVB acting as a binder and 0.8 wt % of dioctyl phthalate acting as a plasticizer were added, and the resulting mixture was further subjected to grinding and dispersing processing with a ball mill. In this manner, a slurry for sheet formation was prepared. The recovered slurry was defoamed and concentrated with a vacuum defoaming process, and the viscosity of the slurry was adjusted at 60 poise.

The slurry having the adjusted viscosity was coated with a coater onto a film base, to which a releasing agent had been applied. The slurry was thus molded into a sheet shape. The resulting molded material was left to stand at the room temperature for 24 hours and dried. The molded material was then separated from the film base. The molded material having been separated from the film base was located on a setter (sapphire) within a tubular sintering furnace (EPKR-18K, manufactured by Koyo Thermo Systems, Co., Ltd.) utilizing a quartz tube and subjected to binder removal processing in air at a temperature of 470° C. Thereafter, the molded material was subjected to sintering processing at a sintering temperature of 800° C. and in a nitrogen atmosphere formed with introduction of nitrogen at a flow rate of 500 cc/min. (At this time, the oxygen partial pressure was equal to 10 Pa.) In this manner, a $Bi_{12}TiO_{20}$ sintered material was obtained. Here, the oxygen partial pressure in the furnace is measured by setting an oxygen concentration meter of a zirconia type.

Example 2

A $Bi_{12}TiO_{20}$ sintered material was obtained in the same manner as that in Example 1, except that the sintering processing was performed in an argon atmosphere (flow rate: 500 cc/min) (At this time, the oxygen partial pressure was equal to 10 Pa.)

Example 3

A $Bi_{12}TiO_{20}$ sintered material was obtained in the same manner as that in Example 1, except that the sintering processing was performed in a helium atmosphere (flow rate: 500 cc/min) (At this time, the oxygen partial pressure was equal to 10 Pa.)

Example 4

A $Bi_{12}SiO_{20}$ sintered material was obtained in the same manner as that in Example 1, except that $SiO_2$ particles were utilized as the raw material in lieu of the $TiO_2$ particles.

Example 5

A $Bi_{12}SiO_{20}$ sintered material was obtained in the same manner as that in Example 2, except that $SiO_2$ particles were utilized as the raw material in lieu of the $TiO_2$ particles.

Example 6

A $Bi_{12}GeO_{20}$ sintered material was obtained in the same manner as that in Example 1, except that $GeO_2$ particles were utilized as the raw material in lieu of the $TiO_2$ particles.

Example 7

A $Bi_{12}TiO_{20}$ sintered material was obtained in the same manner as that in Example 1, except that a box type of an electric furnace which uses a metal muffle (UBF-VP, manufactured by Koyo Thermo Systems Co., Ltd.) was utilized as the sintering furnace. The oxygen partial pressure was equal to $5\times10^{-3}$ Pa.

Example 8

A $Bi_{12}TiO_{20}$ sintered material was obtained in the same manner as that in Example 7, except that an argon gas mixed with 10 ppm of oxygen was utilized. The oxygen partial pressure was equal to 0.3 Pa.

Example 9

A $Bi_{12}TiO_{20}$ sintered material was obtained in the same manner as that in Example 7, except that an argon gas mixed with 100 ppm of oxygen was utilized. The oxygen partial pressure was equal to 5 Pa.

Example 10

A $B_{12}SiO_{20}$ sintered material was obtained in the same manner as that in Example 7, except that $SiO_2$ particles were utilized as the raw material in lieu of the $TiO_2$ particles. The oxygen partial pressure was equal to $5\times10^{-3}$ Pa.

Example 11

A $Bi_{12}GeO_{20}$ sintered material was obtained in the same manner as that in Example 7, except that $GeO_2$ particles were utilized as the raw material in lieu of the $TiO_2$ particles. The oxygen partial pressure was equal to $5\times10^{-3}$ Pa.

Comparative Example 1

A $Bi_{12}TiO_{20}$ sintered material was obtained in the same manner as that in Example 1, except that the sintering processing was performed in air (flow rate: 500 cc/min, oxygen partial pressure: $2\times10^4$ Pa).

Comparative Example 2

A $Bi_{12}SiO_{20}$ sintered material was obtained in the same manner as that in Example 4, except that the sintering processing was performed in air (flow rate: 500 cc/min, oxygen partial pressure: $2\times10^4$ Pa).

Comparative Example 3

A $Bi_{12}GeO_{20}$ sintered material was obtained in the same manner as that in Example 6, except that the sintering processing was performed in air (flow rate: 500 cc/min, oxygen partial pressure: $2\times10^4$ Pa).

Each of the sintered materials, which had been obtained in Examples 1 to 11 and Comparative Examples 1, 2, and 3, was joined with an Al substrate by use of an electrically conductive paste dotite (supplied by Fujikura Kasei K.K.). Also, a gold layer having a thickness of 60 nm was formed as a top electrode with a sputtering technique on the sintered material. Thereafter, an X-ray photo-current signal was applied under the condition of a voltage of 80 kV, and 10 mR X-rays were irradiated for 0.1 second. A pulsed photo-current occurring under the condition of voltage application (the voltage was applied so as to correspond to an electric field of 2.5 V/μm) was converted into a voltage by use of a current amplifier, and the voltage was measured with a digital oscilloscope. In accordance with the obtained current-time curve, integration was made within the range of the X-ray irradiation time, and the sensitivity was measured as the quantity of the formed electric charges.

Table 1 below shows the conditions and the sensitivities of the sintered materials in Examples 1 to 11 and Comparative Examples 1, 2, and 3. The sensitivity of the sintered material, which had been obtained in each of Examples 1, 2, and 3, was represented as a relative value with respect to the sensitivity of the sintered material, which had been obtained in Comparative Example 1. The sensitivity of the sintered material, which had been obtained in each of Examples 4 and 5, was represented as a relative value with respect to the sensitivity of the sintered material, which had been obtained in Comparative Example 2. The sensitivity of the sintered material, which had been obtained in Example 6, was represented as a relative value with respect to the sensitivity of the sintered material, which had been obtained in Comparative Example 3. The sensitivity of the sintered material, which had been obtained in each of Examples 7, 8, and 9, was represented as a relative value with respect to the sensitivity of the sintered material, which had been obtained in Comparative Example 1. The sensitivity of the sintered material, which had been obtained in Example 10, was represented as a relative value with respect to the sensitivity of the sintered material, which had been obtained in Comparative Example 2. Also, the sensitivity of the sintered material, which had been obtained in Example 11, was represented as a relative value with respect to the sensitivity of the sintered material, which had been obtained in Comparative Example 3.

TABLE 1

| | Sintered material | Atmosphere condition | Sensitivity |
|---|---|---|---|
| Example 1 | $Bi_{12}TiO_{20}$ | $N_2$ | 2 |
| Example 2 | $Bi_{12}TiO_{20}$ | Ar | 2.7 |
| Example 3 | $Bi_{12}TiO_{20}$ | He | 2.7 |
| Example 4 | $Bi_{12}SiO_{20}$ | $N_2$ | 3 |
| Example 5 | $Bi_{12}SiO_{20}$ | Ar | 3.3 |
| Example 6 | $Bi_{12}GeO_{20}$ | $N_2$ | 9 |

TABLE 1-continued

| | Sintered material | Atmosphere condition | Sensitivity |
|---|---|---|---|
| Example 7 | $Bi_{12}TiO_{20}$ | Ar | 5 |
| Example 8 | $Bi_{12}TiO_{20}$ | $O_2/Ar$ | 4.8 |
| Example 9 | $Bi_{12}TiO_{20}$ | $O_2/Ar$ | 3.2 |
| Example 10 | $Bi_{12}SiO_{20}$ | Ar | 3.7 |
| Example 11 | $Bi_{12}GeO_{20}$ | Ar | 10 |
| Comp. Example 1 | $Bi_{12}TiO_{20}$ | Air | 1 |
| Comp. Example 2 | $Bi_{12}SiO_{20}$ | Air | 1 |
| Comp. Example 3 | $Bi_{12}GeO_{20}$ | Air | 1 |

As clear from Table 1, in cases where the sintering processing was performed in the inert gas atmosphere, the $Bi_2MO_{20}$ sintered material, which had a sensitivity two to nine times as high as the sensitivity obtained in cases where the sintering processing was performed in air, was capable of being obtained. Also, in each of Examples 7, 8, 9, 10, and 11, in which the sintering furnace which uses the muffle furnace was utilized, the oxygen partial pressure was capable of being lowered to as low as $5 \times 10^{-3}$ Pa, and the sensitivity was capable of being enhanced markedly.

As described above, with the first process for producing a photo-conductor layer in accordance with the present invention, the sintering processing for the formation of the $Bi_{12}MO_{20}$ sintered material is performed in the inert gas atmosphere. Therefore, the $Bi_{12}MO_{20}$ sintered material having been obtained with the first process for producing a photo-conductor layer in accordance with the present invention has the advantages over the $Bi_{12}MO_{20}$ sintered material, which is obtained with the conventional sintering processing performed in air, in that the $Bi_{12}MO_{20}$ sintered material having been obtained with the first process for producing a photo-conductor layer in accordance with the present invention is free from crystal defects. Accordingly, in cases where the aforesaid defect-free $Bi_{12}MO_{20}$ sintered material is utilized for constituting the photo-conductor layer, a radiation imaging panel having a high sensitivity is capable of being obtained.

Examples II (Preparation of $Bi_{12}SiO_{20}$ Sintered Material)

Bismuth oxide ($Bi_2O_3$) particles and silicon oxide ($SiO_2$) particles were mixed together in a molar ratio of 6:1. The resulting mixture was then subjected to grinding and mixing processing by use of a ball mill. Thereafter, the mixture having been subjected to the grinding and mixing processing was filled in a platinum crucible and heated at a temperature of 800° C. for eight hours under air within a muffle furnace. With a powder X-ray analysis, it was confirmed that the thus obtained particles were $Bi_{12}SiO_{20}$ particles. The thus obtained $Bi_{12}SiO_{20}$ particles were ground by use of a mortar. Thereafter, 80 g of the thus ground $Bi_{12}SiO_{20}$ particles, 100 ml of ethanol, 3.65 g of a polyvinyl butyral, and 0.7 g of trioctyl phosphate were mixed together by use of a ball mill. Also, part of ethanol was removed by distillation under reduced pressure, and a viscous dispersion was thereby obtained. The thus obtained viscous dispersion was coated onto a polyethylene terephthalate sheet such that the dry film thickness of 600 μm was obtained. In this manner, a green sheet for ceramic formation was prepared.

The thus prepared green sheet was cut into a 5 cm-square piece. The thus obtained green sheet piece was set on the setter 22 in the sintering furnace 23 of the apparatus illustrated in FIG. 2. Also, air was introduced into the sintering furnace 23, and the green sheet piece was heated and dried at a temperature of 600° C. for six hours. Thereafter, the predetermined gas of each of A to G listed in Table 2 below was introduced into the sintering furnace (KTF 433, manufactured by Koyo Thermo Systems Co., Ltd.) at a flow rate of 200 ml/min. The sintering processing was thus performed at a temperature of 844° C. for six hours, and a $Bi_{12}SiO_{20}$ sintered material was thereby obtained.

Each of the flow rates of the multiple kinds of the gases was controlled with a mass flow meter. The multiple kinds of the gases were introduced into the sintering furnace 23 via a gas mixing device. The oxygen partial pressure within the sintering furnace 23 was measured by use of a zirconia type of an oxygen concentration meter, which was associated with the discharging flow path 29.

TABLE 2

| Gas atmosphere | Gas constituent (mixing ratio in parenthesis) | Flow rate (ml/min) |
|---|---|---|
| A | Air | 200 |
| B | Pure argon | 200 |
| C | Argon (89) + $CO_2$ (11) | 200 |
| D | Argon (89) + $CO_2$ (10) + 0.001% CO-containing argon (1) | 200 |
| E | Argon (89) + $CO_2$ (10) + 0.01% CO-containing argon (1) | 200 |
| F | Argon (89) + $CO_2$ (10) + 0.1% CO-containing argon (1) | 200 |
| G | Argon (89) + $CO_2$ (10) + 1% CO-containing argon (1) | 200 |

(Preparation of $Bi_{12}GeO_{20}$ Sintered Material)

A green sheet was prepared in the same manner as that in the preparation of the $Bi_{12}SiO_{20}$ sintered material described above, except that germanium oxide ($GeO_2$) particles were utilized in lieu of the silicon oxide particles. The sintering processing was performed at a sintering temperature of 885° C. in the atmosphere of each of A and D listed in Table 2. In this manner, a $Bi_{12}GeO_{20}$ sintered material was obtained.

(Preparation of $Bi_{12}TiO_{20}$ Sintered Material)

A green sheet was prepared in the same manner as that in the preparation of the $Bi_{12}SiO_{20}$ sintered material described above, except that titanium oxide ($TiO_2$) particles were utilized in lieu of the silicon oxide particles. The sintering processing was performed at a sintering temperature of 800° C. in the atmosphere of each of A and F listed in Table 2. In this manner, a $Bi_{12}TiO_{20}$ sintered material was obtained.

A gold electrode was formed with a vacuum evaporation technique on each of opposite surfaces of the ceramic plate-like sintered material having been obtained in the manner described above. A voltage of 1 kV was applied across the gold electrodes. In this state, X-rays having been produced by a medical tungsten tube at 70 kV were irradiated for 0.1 second to the sintered material. The quantity of electric charges generated was measured from a transient current occurring at this time. The quantity of electric charges generated was divided by the absorption dose, and the sensitivity was thereby calculated. Table 3 shows the oxygen partial pressure and the sensitivity of each sintered material having been obtained from the sintering processing. The sensitivity of each sintered material was represented as the relative sensitivity with the sensitivity of the sintered material, which was obtained from the sintering processing performed in the atmosphere of A, being taken as 1.

TABLE 3

| Sample No. | Kind of sintered material | Gas atmosphere | Oxygen partial pressure (Pa) | Sensitivity (relative value) |
|---|---|---|---|---|
| 1 | $Bi_{12}SiO_{20}$ | A | $2 \times 10^4$ | 1 |
| 2 | $Bi_{12}SiO_{20}$ | B | 1.1 | 2.1 |
| 3 | $Bi_{12}SiO_{20}$ | C | 11 | 1.3 |
| 4 | $Bi_{12}SiO_{20}$ | D | 0.11 | 3.5 |
| 5 | $Bi_{12}SiO_{20}$ | E | 0.011 | 3.8 |
| 6 | $Bi_{12}SiO_{20}$ | F | $1 \times 10^{-3}$ | 3.7 |
| 7 | $Bi_{12}SiO_{20}$ | G | $1 \times 10^{-7}$ | 0.3 |
| 8 | $Bi_{12}GeO_{20}$ | A | $2 \times 10^4$ | 1 |
| 9 | $Bi_{12}GeO_{20}$ | D | 0.11 | Approx. 3 |
| 10 | $Bi_{12}TiO_{20}$ | A | $2 \times 10^4$ | 1 |
| 11 | $Bi_{12}TiO_{20}$ | F | $1 \times 10^{-3}$ | 2.8 |

With the second process for producing a photo-conductor layer containing the $Bi_{12}MO_{20}$ sintered material in accordance with the present invention, the sintering processing for the formation of the $Bi_{12}MO_{20}$ sintered material is performed in the atmosphere, in which the oxygen partial pressure $P_{O2}$ (Pa) satisfies the condition $10^{-3} \leq P_{O2} \leq 10^{-1}$. Therefore, as clear from Table 3, the sintered material (each of sample Nos. 4, 5, 6, 9, and 11 listed in Table 3) having been produced with the second process for producing a photo-conductor layer in accordance with the present invention had a sensitivity approximately three to four times as high as the sensitivity of the sintered material, which had been obtained from the sintering processing performed in air. It was assumed that the high sensitivity was obtained since the $Bi_{12}MO_{20}$ sintered material free from crystal defects was capable of being produced.

Particularly, with the second process for producing a photo-conductor layer in accordance with the present invention, the sintering processing was performed in the atmosphere, such that the ratio of the carbon monoxide partial pressure $P_{CO}$ to the carbon dioxide partial pressure $P_{CO2}$ satisfied the condition:

$$0.001\%/10 \ (=10^{-6}) \leq P_{CO}/P_{CO2} \leq 0.1\%/10 \ (=10^{-4})$$

Therefore, the oxygen partial pressure was capable of being controlled easily with the reaction represented by the formula $2CO + O_2 \rightarrow CO_2$. Accordingly, the $B_{12}MO_{20}$ sintered material free from crystal defects was capable of being obtained.

What is claimed is:

1. A process for producing a photoconductor layer for constituting a radiation imaging panel, which photo-conductor layer is capable of recording radiation image information as an electrostatic latent image, the photo-conductor layer containing a $Bi_{12}MO_{20}$ sintered material, in which M represents at least one kind of element selected from the group consisting of Ge, Si, and Ti, the process comprising the step of:
    performing sintering processing for the formation of the $Bi_{12}MO_{20}$ sintered material in an inert gas atmosphere, wherein an oxygen partial pressure in the inert gas atmosphere falls within the range of $1 \times 10^{-5}$ Pa to 20 Pa.

2. A process as defined in claim 1 wherein the inert gas is a rare gas.

3. A process as defined in claim 2 wherein an oxygen partial pressure in the inert gas atmosphere falls within the range of $1 \times 10^{-5}$ Pa to 20 Pa.

4. A process as defined in claim 3 wherein the sintering processing is performed in a sintering furnace which uses a metal muffle.

5. A process as defined in claim 1 wherein the sintering processing is performed in a sintering furnace which uses a metal muffle.

6. A process for producing a photo-conductor layer for constituting a radiation imaging panel, which photo-conductor layer is capable of recording radiation image information as an electrostatic latent image, the photo-conductor layer containing a $Bi_{12}MO_{20}$ sintered material, in which M represents at least one kind of element selected from the group consisting of Ge, Si, and Ti, the process comprising the step of:
    performing sintering processing for the formation of the $Bi_{12}MO_{20}$ sintered material at a sintering temperature falling within the range of 800° C. to 900° C. and in an atmosphere,
    in which an oxygen partial pressure $P_{O2}$ (Pa) satisfies the condition $10^{-3} \leq P_{O2} \leq 10^{-1}$.

7. A process as defined in claim 6 wherein the sintering processing is performed in the atmosphere, such that a ratio of a carbon monoxide partial pressure $P_{CO}$ to a carbon dioxide partial pressure $P_{CO2}$ satisfies the condition $10^{-6} \leq P_{CO}/P_{CO2} \leq 10^{-4}$.

* * * * *